United States Patent
Condie et al.

(10) Patent No.: US 6,505,918 B1
(45) Date of Patent: Jan. 14, 2003

(54) PIEZOELECTRIC MATERIAL AND METHOD OF POLARIZING THE SAME

(75) Inventors: Angus Condie, Swaffham Prior (GB); Stephen Temple, Cambridge (GB); Anthony D. Paton, deceased, late of Longstanton St. Michael (GB), by Christine Bryce, legal representative

(73) Assignee: Xaar Technology Limited, Cambridge (GB)

( * ) Notice: Subject to any disclaimer, the term of this patent is extended or adjusted under 35 U.S.C. 154(b) by 0 days.

(21) Appl. No.: 09/657,671

(22) Filed: Sep. 8, 2000

Related U.S. Application Data

(63) Continuation of application No. PCT/GB99/00718, filed on Mar. 10, 1999.

(30) Foreign Application Priority Data

Mar. 11, 1998 (GB) .............................................. 9805038

(51) Int. Cl.[7] .............................................. B41J 2/045
(52) U.S. Cl. ...................................................... 347/69
(58) Field of Search ............................. 347/69, 70, 71, 347/72, 68, 54, 20; 29/25, 35; 310/328, 357; 427/585

(56) References Cited

U.S. PATENT DOCUMENTS

| | | | |
|---|---|---|---|
| 4,503,352 A | 3/1985 | Inoue | 310/359 |
| 4,633,204 A | 12/1986 | Gounji et al. | 333/186 |
| 4,887,100 A | 12/1989 | Michaelis et al. | 347/69 |
| 5,666,144 A | 9/1997 | Zhang | 347/69 |
| 5,731,048 A * | 3/1998 | Ashe et al. | 427/585 |
| 5,777,425 A | 7/1998 | Ino et al. | 310/359 |

FOREIGN PATENT DOCUMENTS

| | | | |
|---|---|---|---|
| EP | 0 173 332 A2 | 3/1986 | H03H/9/56 |
| EP | 0 693 789 A2 | 1/1996 | H01L/41/107 |
| JP | 1-232811 | 9/1989 | H03H/3/02 |
| JP | 1-232812 | 9/1989 | H03H/3/02 |
| JP | 4-259563 | 9/1992 | B41J/2/16 |
| JP | 5-147215 | 6/1993 | B41J/2/045 |
| WO | WO 95/07820 | 3/1995 | |

OTHER PUBLICATIONS

International Search Report in PCT/GB99/00718 dated Jun. 4, 1999.
International Preliminary Examination Report in PCT/GB99/00718 dated May 15, 2000.

* cited by examiner

*Primary Examiner*—John S. Hilten
*Assistant Examiner*—K. Feggins
(74) *Attorney, Agent, or Firm*—Marshall, Gerstein & Borun

(57) ABSTRACT

A method of polarizing a portion of a monolithic piezoelectric actuator element for use in droplet deposition apparatus where the element has first and second portions, includes the steps of placing the first portion of the element at an equipotential and generating a polarizing electric field across the second portion between said first portion and a further conducting layer.

25 Claims, 4 Drawing Sheets

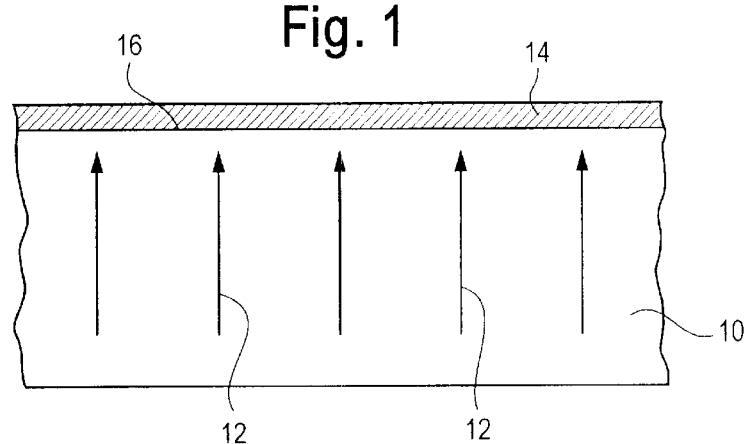
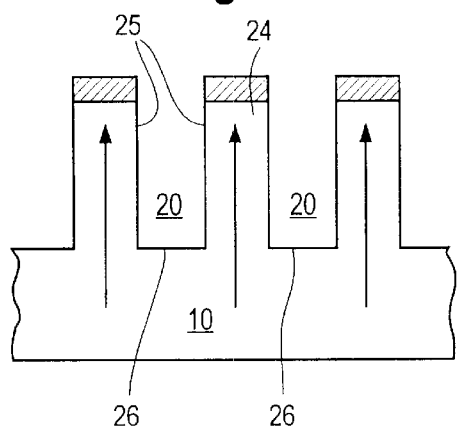
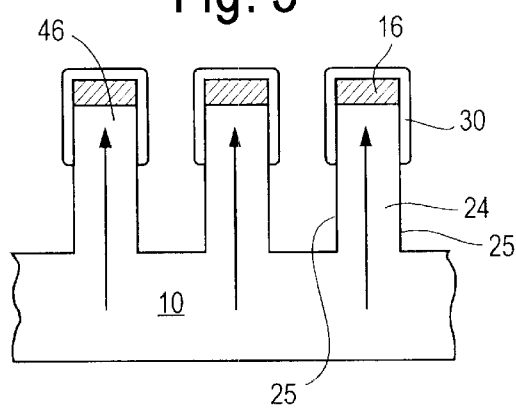

PIEZOELECTRIC MATERIAL AND METHOD OF POLARIZING THE SAME

This is a continuation of International Application No. PCT/GB99/00718 filed Mar. 10, 1999, the entire disclosure of which is incorporated herein by reference.

The present invention relates to droplet deposition apparatus, particularly inkjet printheads, incorporating piezoelectric actuator elements having first and second portions both deflectable simultaneously to effect ejection of a droplet.

Such printheads are known, for example, from EP-A-0 277 703 (incorporated herein by reference): an ink chamber is bounded on at least one side by an actuator wall constructed from upper and lower portions of piezoelectric material bonded together at their common surface and polarised in the plane of the actuator wall in respective opposite senses. When subjected to an electric field perpendicular to the direction of polarisation by electrodes located on opposite sides of the actuator wall, both upper and lower portions deform in shear towards the ink chamber, thereby causing the ejection of a droplet from the ink chamber via a nozzle. Such an actuator wall construction has acquired the name of "chevron" from the shape taken up by the actuator wall as a whole when subject to actuating electric fields.

To date the techniques for manufacturing chevron printheads have been complex, involving either special piezoelectric laminates into which full-depth ink channels are formed (for example WO92/09436) or the intricate alignment of two piezoelectric sheets each formed with half-depth ink channels (for example the aforementioned EP-A-0 277 703). The actuator walls of such known chevron printheads furthermore include discontinuities in the form of adhesive bonds and/or negative temperature coefficient layers.

It is an object of the present invention to avoid the complexities of manufacture and structural discontinuities of known chevron constructions.

Accordingly, the present invention consists of a method of polarising a portion of a monolithic piezoelectric actuator element for use in droplet deposition apparatus, the element having first and second portions, the method comprising the steps of:

placing the first portion of the element at an equipotential, and generating a polarising electric field across the second portion between said first portion and a further conducting layer.

Such a method allows a portion of a monolithic piezoelectric element to be subject to polarising electric fields whilst maintaining another portion of the same element free from repolarisation by holding that portion at an equipotential, advantageously be partial enclosure by a conducting layer which effectively holding that portion free from electric fields in the manner of an at last partial Faraday cage. In the particular case of an actuator element that is initially polarised entirely in one direction, it allows a portion of that element to be repolarised in a opposite direction, the resulting actuator having a chevron poling pattern. The monlithic—i.e. one-piece, integral, homogeneous, uniform—construction of such an actuator avoids the disadvantages of the known constructions discussed above.

A corresponding component for use in droplet deposition apparatus is included in another aspect of the invention and comprises a homogeneous sheet of piezo-material formed with a multiplicity of parallel, open-topped channels mutually spaced in an array direction normal to the length of the channels and defined each by facing side walls and a bottom surface extending between the side walls;

at least one of said side walls having a first portion remote from a respective bottom surface and a second portion adjacent said respective bottom surface, said second portion being polarised in a direction normal to both the length of the channels and the array direction and said first portion being either unpolarised or polarised in a direction other than said first direction.

Such a component has side walls polarised according to two different regimes and yet retains a homogeneous structure with the associated strength and ease of manufacture that this implies.

Further advantageous embodiments of the invention are set out in the description and dependent claims.

The invention is now described by way of example by reference to the following diagrams, of which:

FIGS. 1–3 are cross-sectional view taken normal to an ink channel axis illustrating the conventional manufacturing steps involved in the realisation of a first embodiment of the present invention;

Figure 4:
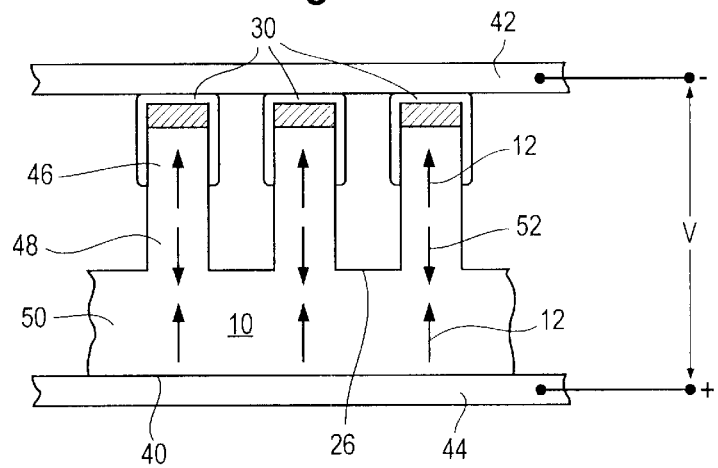
FIGS. 4 and 5 are cross-sectional views illustrating the application of polarising electric fields in accordance with the present invention.

FIG. 1 is a cross-sectional view of the starting point for the method according to the present invention, namely a monolithic, homogeneous, uniform sheet 10 of piezo-material (e.g. lead zirconium titanate, PZT) poled in its thickness direction as indicated by arrows 12 and carrying a thin layer 14 of masking material on one surface 16.

Referring to the cross-sectional view of FIG. 2, a multiplicity of open-topped channels 20 are formed in the surface 16 of the sheet 10, thereby the define homogeneous channel walls 24 of piezo-material, facing side wall surfaces 25 and a bottom surface 26 extending between the side wall surfaces. The resultant array of parallel channels extends in a direction lying normal to the longitudinal axes of the channels.

Each wall 24 then has an electrode 30—typically of aluminium, nickel or gold—formed on an upper portion 46 thereof, as shown in FIG. 3, so as to extend in an electrically-continuous fashion approximately half way down wall sides 25 and over masking layer 16, thereby surrounding the upper portion 45 of each wall. Electrode 30 will also be deposited over masking material 14 on the surface 16 of the piezoelectric sheet 10 in those areas where channels have not been formed. All aspects of the arrangement described above are known in the art, for example from EP-A-0 364 136, EP-A-0 309 148 and EP-A-0 397 441, all of which are incorporated herein by reference.

Considering now FIG. 4, a potential difference V is applied between each electrode 30 and the surface 40 on the opposite side of sheet 10 to surface 16, thereby generating an electric field that is of opposite sign to the initial sheet polarisation direction 12, parallel to the side wall surfaces 25 and perpendicular to the longitudinal axis of the channel (which extends out of the page in the view of FIG. 4). In the embodiment shown, this is achieved by means of an upper conductive member 42 placed across the electrodes 30 and by a lower conductive member 44 pressed against lower surface 40. Member 44 may itself be a conductive coating, applied to the sheet before formation of the channels or in the course of the deposition of the electrodes 30. Alternatively, both members 42 and 44 may comprise a conductive yet resilient material—e.g. silver-loaded rubber—so as to be able to accommodate the deformation that is known to result when piezo-material is subjected to a poling electric field. Instead of using upper conductive member 42, the poling potential difference V can be applied to the electrode material 30 on the aforementioned area of the sheet surface in which no channels are formed (and which will be in electrical contact with the electrodes 30 formed on the upper portions of the channel walls).

The strength of the electric field varies throughout the section: in the upper wall portion 46 remote from the channel bottom surface 26 and partially enclosed by electrode 30, no significant electric field is generated as a result of the entirety of the electrode 30 covering the wall—and consequently the upper wall portion 46 itself—being at an equipotential. Electrode 30 can also be considered as a partial Faraday cage, protecting the upper wall portion 46 which it surrounds from electric fields. As a result, the state of polarisation of the upper wall portion does not change from that of the original sheet (indicated by arrow 12). Although electrode 30 is shown extending over the masking layer 16 located on top of each channel wall 24, it will be appreciated that a similar effect will be achieved if the upper wall portion 46 is enclosed by an electrode located only on the channel wall sides 25, effectively sandwiching the piezoelectric material.

Turning now to the lower wall portion 48 lying adjacent to the channel bottom surface 26, there is setup between the lower extremities of the electrode 30 and the lower surface 40 of the sheet 10 an electric field. between the lower wall portion 48 and a base portion 50 lying between channel bottom surface 26 and sheet lower surface 40 there is a significant difference is geometry which in turn gives rise to a significantly greater field strength $E_w$ in the lower wall portion 48 compared to the strength $E_b$ in the base portion.

By suitable choice of the value of the potential difference V, a value of field strength $E_w$ can be established in the lower wall portion 48 that is sufficient to change the direction of polarisation of the piezoelectric material in that portion to a direction—indicated by arrow 52 in FIG. 4—opposite to the direction 12 in which the upper wall portion 46 is polarised, thereby achieving a monolithic wall structure of homogeneous, uniform piezo-material that is furthermore polarised in a "chevron" configuration.

The field strength $E_b$ generated in the base portion 50 will, however, be low enough (approximately 0.5 $E_w$ in the case where channels and channel walls have the same width) not to reverse the direction of polarisation 12 of the piezoelectric material in the base. This is in itself advantageous: as explained in the aforementioned EP-A-0 364 136, in an actuator in which the base portion and adjacent wall are polarised in the same direction, fringe electric fields can give rise to a distortion of the base that acts against the motion of the walls, thereby reducing the pressure generated in the ink channel and the velocity of ejection of the ink droplet. In contrast, a base portion that is polarised in the opposite direction to the lower wall portion per FIG. 4 will tend to act in such a way as to reinforce the pressure generated by the movements of the walls.

In is nevertheless possible to reverse the direction of polarisation of the base portion 50 by choosing potential difference V to be of sufficient magnitude that not only $E_w$ but also $E_b$ is strong enough to cause a reversal in the direction of polarisatiry of the wall and base portions of the sheet respectively.

Figure 5:
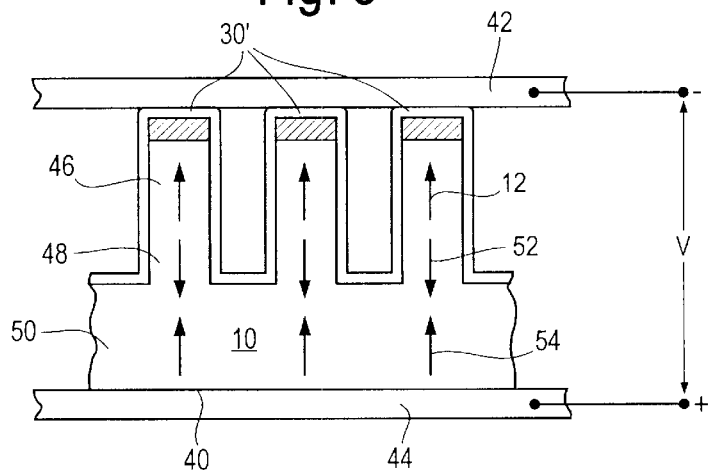

Alternatively, the base portion of the sheet can be repolarised using the arrangement of FIG. 5 in which electrodes 30 are extended—for example using the same 'shaded plating' process used in their initial deposition—down to the bottom surface 26 of the channel so as to enclose both upper and lower wall portions 46,48. Such electrodes are shown at 30' in FIG. 5. Less discriminating conventional techniques such as electroless deposition or sputtering can be used to apply a conductive layer that extends not only down the walls but across the bottom surface 26 of the channel as well. A potential difference of sufficient strength to polarise the base in the desired direction, parallel to the direction of polarisation of the upper and lower wall portions 46,48, is then applied between each of the extended electrodes 30' and the lower surface 40 of the sheet 10 so as to generate an electric field sufficient to pole the base portion in the direction 54. Extended electrode 30' again ensures that not repolarisation takes place of those upper and lower wall portions 46,48 which it encloses, as described above with regard to FIG. 4. It will be appreciated that this latter technique can also be used—with an electric field of the appropriate direction—to repolarise in original direction 12 any part of the base that may have lost its polarisation in the course of earlier processing steps.

Figure 6A:
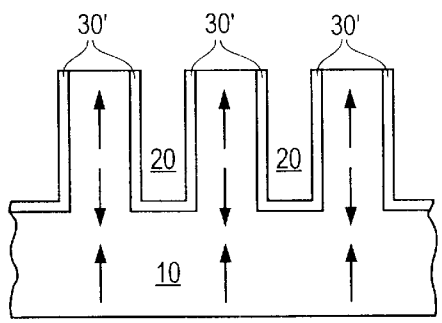
FIG. 6(a) illustrates the finished actuator with actuating electrodes.

It will be appreciated that electrodes that extend over the side wall surfaces of both upper and lower wall portions will be required for actuation of the actuator wall, regardless of whether the same electrodes are also used in any repolarisation step. To do this, however, electrodes in adjacent channels must first be electrically isolated from one another. In a final step that is common to both the embodiments of both FIGS. 4 and 5, this is achieved by removing the masking layer 16 from the top of the channel walls—for example by means of a solvent as is known in the art—the masking layer taking with it any electrode material deposited thereon so as to leave the tops of the walls free and the electrodes in adjacent channels electrically isolated from one another as shown in FIG. 6(a). Should a conductive coating have been applied to the lower surface 40 of the sheet 10 for poling purposes, this can also be removed if necessary.

Figure 6B:
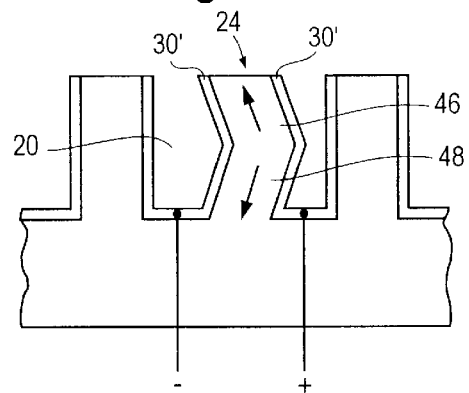
FIG. 6(b) illustrates the displacement of an actuated channel wall.

The electrodes for each channel can then be connected to respective drive circuitry as is well-known, e.g. from WO95/07820 (incorporated herein by reference). FIG. 6(b) shows, exaggerated, the deflection of a channel wall that results when respective positive and negative voltages (shown schematically but in fact applied via connections at the end of each channel as explained with reference to FIG. 7) are applied to the electrodes 30' of the channels 20 either side of the wall. The resulting electric field, oriented normal to the direction of polarisation of the upper and lower wall portions 46,48 causes both portions to shear in opposite senses simultaneously, the wall as a whole deflecting normal to the direction of polarisation and into the aforementioned chevron shape. Droplet ejection according to these principles is well-known in the art, as is the arrangement—known e.g. from EP-A-0 278 590, incorporated herein by reference—of a number of actuator walls in parallel so as to as to define therebetween an array of parallel ink channels that extend in an array direction normal to the length of the channels. Ink ejection is achieved by actuation of the walls on both sides of a channel, with each actuator wall being displaceable in opposite directions so as to effect droplet ejection from the channels located on either side of that actuator—so-called "shared wall" operation.

Figure 7:
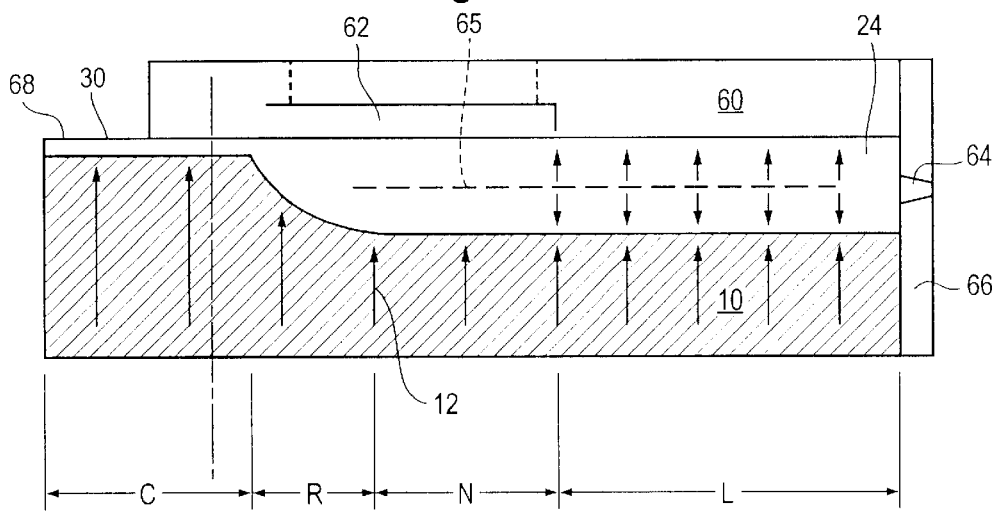
FIGS. 7 and 8 are sectional views along the ink channel axis of a printhead polarised in accordance with a second embodiment of the invention.

FIG. 7 is a sectional view taken along the longitudinal channel axis (indicated by dashed line 65) of a printhead incorporating a channelled piezoelectric component 10 poled in accordance with the present invention. As is known in the art, a cover member 60 having an ink supply aperture 62 is attached to the tops of the walls 24, thereby closing the channel on all sides parallel to the longitudinal channel axis over a so-called "active" length, denoted L. A nozzle 64 formed in a nozzle plate 66 is attached at one end of the channel, whilst at the other end, denoted C, a connection is made (e.g. by wire bond 68) from the channel electrode 30 to drive circuitry (not shown).

In those "non-active" areas of the channel (R and N) open on at least one side for communication with the ink supply aperture 62, a low dielectric coating is applied to the channel walls prior to any plating so as to reduce the capacitance of the printhead overall. Such an arrangement is known from WO97/39897, incorporated herein by reference. As a result, any conducting layer subsequently deposited in accordance with the present invention is unable to effect either repolarisation or actuation in these areas of the channel.

Alternative capacitance-reducing measures suitable for use in the non-active areas of the channel include the use of a low-dielectric material to form the channel walls, as describe in U.S. Pat. No. 5,619,235, and the reduction the area of the channel electrode to the minimum necessary for conduction of electrical signals from the drive circuit connection 68 at the rear of the printhead (region C) to the full-depth channel electrodes in the active length L of the channel, described in the aforementioned WO97/39897.

Figure 8:
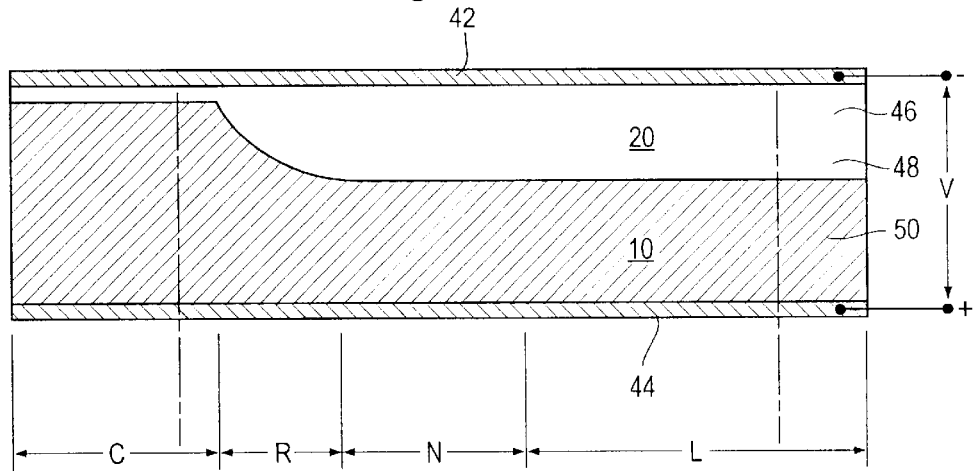

FIG. 8 illustrates an arrangement for repolarising a channelled piezoelectric component of the kind shown in FIG. 7. Despite the fact that repolarisation is only required in the active portion of the channel, best repolarisation results have been obtained using upper and lower conductive members 42,44 that extend the length of the printhead (and the length of the sheet in the case, described in WO95/18717, where several channelled components are formed in a single sheet).

In a typical printhead, a droplet fluid channel may have an active length (L) of around 1 mm, a total channel length (L+N+R) of 8.5 mm, a channel width of 75 $\mu$m, a channel wall width of 65 $\mu$m and a channel wall height of 300 $\mu$m. A potential difference V of approximately 1000 V has been found necessary to reverse the direction of polarisation in the lower wall portion 48 of such a printhead when made from a pre-polarised piezoelectric material such as HD3203 from Motorola. It has been established that in such material, an electric field strength of at least 1.2 V/$\mu$m is required before the direction of pre-polarisation starts to change (so-called coercive field strength), with a field of around 1.7 V/$\mu$m being required to achieve permanent repolarisation (so-called field for reversal to saturation) at a level approximately 90% of the initial level of pre-polarisation. The corresponding electric field strength in the base portion 50 (which, at around 600 $\mu$m, has a thickness equal to twice the channel height) is of the order of 0.75 V/$\mu$m and is consequently insufficient to effect permanent repolarisation.

It will be appreciated that the high value of poling voltage V applied across the relatively low thickness of the channelled piezoelectric sheet 10 necessitates the use of a non-conducting atmosphere to avoid arcing. Fluorinert (a Trade Mark of DuPont) has been found to be particularly effective in this regard, although it is noted that polarisation under a vacuum could conveniently be carried out in the same chamber as any preceding or subsequent electrode deposition steps, reducing manufacturing time.

Figure 9:
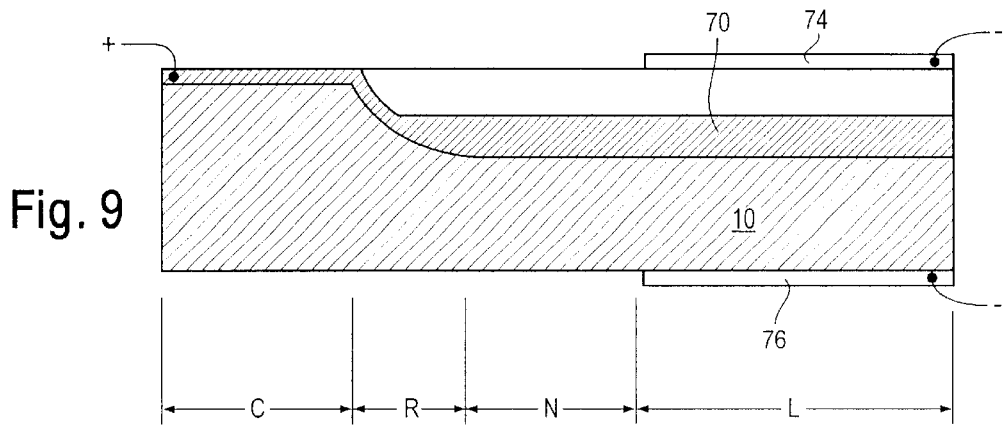
FIGS. 9–11 are sectional views illustrating the polarisation of a printhead according to a third embodiment of the invention.
Figure 10:
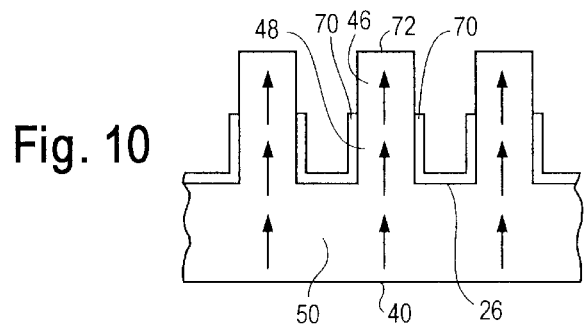

FIGS. 9 and 10 illustrate—in sectional views taken parallel and normal to the channel axis respectively—an alternative arrangement for polarising a portion of a piezoelectric actuating wall. In contrast to the arrangement of FIG. 4, an electrode 70 is located so as to partially enclose on both sides the lower wall portion 48 lying adjacent the channel bottom surface 26. This may be difficult to manufacture with the conventional 'shaded plating' electrode deposition methods referred to above, although it may be possible to deposit electrode material along the wall surfaces of both upper and lower wall portions 46,48 by such a method and thereafter remove the coating on surface of the upper wall portion 46 by laser, sand blast or similar method.

A preferred method in accordance with the present invention is to apply an initial, thin 'seed' layer of conducting material to all the channel surfaces, to subsequently remove the seed layer—e.g. by means of a laser or sand blasting—from those areas of the channel walls where an electrode is not required and lastly to employ an electroless plating technique to deposit a thicker layer of electrode material in those areas where the seed layer remains. A material for the seed layer is chosen so as to give good adherence to the piezoelectric material and to be deposited in a manner e.g. sputtering, that allows the entire surface of each channel to be coated. In the present example, the seed material chosen is the same as that used for the electrodes themselves, namely aluminium.

Figure 11:
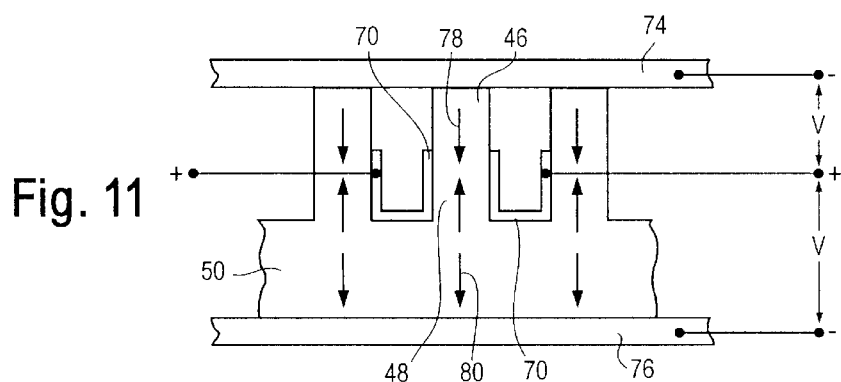

As illustrated in FIG. 11, polarising voltage V is subsequently applied between electrode 70 and conductive members 74,76 located on the uppermost surface 72 of the channel wall and the lower surface 40 of the base portion 50 respectively. A reversal in polarisation direction results at 78 and 80 whilst that lower portion of the wall 48 enclosed by electrodes 70 remains unaffected. It will be appreciated that the arrangement of FIG. 11, with electrode 70 positioned in the middle of the sheet rather that on the upper surface as is the case with electrode 30 of FIG. 4, allows greater repolarisation field densities both in the upper wall 46 portion remote from the channel bottom surface and in the base 50 portion. This is turn allows a reduced polarisation voltage to be employed, with the attendant advantages in terms of size of voltage supply required, the necessary anti-arcing measures, etc.

A final step of depositing an electrode over the whole depth of each channel wall then allows the actuator walls to be operated in chevron mode.

The present invention is particularly suited for use with channelled piezoelectric sheets that have been formed by moulding, as generally known e.g. from EP-A-0 600 748, incorporated herein by reference. However, unlike the commercially available pre-polarised sheet material referred to above, such a component requires polarisation in a single direction throughout its thickness and the application of a masking layer to the tops of the walls prior to application of the techniques outlined above.

It will be appreciated that the present invention has been described by way of examples only and that a wide variety of modifications can be made without departing from the scope of the invention. For example, channels may be formed in more than one side of a sheet of piezo-material, active droplet-ejecting channels may be alternated in the sheet with inactive (so-called "dummy") channels and the nozzle for droplet ejection, rather than being located at the end of the channel, may be arranged intermediate the ends of the channel (the so-called "side-shooter" configuration).

Figure 12:
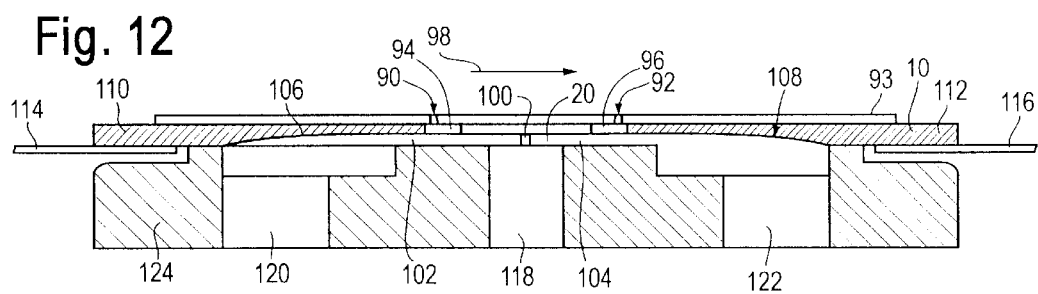
FIG. 12 is a sectional view of a further printhead arrangement incorporating the present invention.

FIG. 12 is a sectional view taken parallel to the channel axis of a such a "side-shooter" printhead incorporating two rows of nozzles 90 and 92 formed in a nozzle plate 93. Such an arrangement, known from co-pending PCT application GB98/03050 (incorporated herein by reference), is notable for the fact that the two rows of nozzles are supplied with ink via respective rows of apertures 94,96 formed in the base of a single channel 20. In the example shown, the array of parallel channels is formed in piezoelectric sheet 10 by sawing, the angle of the longitudinal channel axes relative to the direction of motion of the substrate relative to the printhead (denoted by arrow 98) being chosen such that droplets ejected from first row of nozzles 90 are interleaved on the substrate with droplets ejected from the second row of nozzles 92, thereby doubling the print resolution as is known in the art. The two nozzles in any given channel will also be offset in the substrate motion direction 98 relative to the two nozzles in the channels lying either side the given channel so as to compensate for the time delays in droplet ejection brought about by the three-cycle firing routine commonly used in "shared wall" printheads. Such a routine and associated nozzle offset is well-known, e.g. from EP-A-0 376 532, and consequently will not be discussed in any greater detail here.

With the exception of break 100 separating the electrodes in that half 102 of the channel supplying nozzle 90 from that half 104 supplying nozzle 92, thereby allowing independent operation of the two channel halves, the construction of the channel of FIG. 12 is the same as described previously. The electrode in each channel half runs up the respective channel run-out 106, 108 to sheet edges 110,112 where it connects to driver circuitry 114,116 typically in the form of an integrated circuit (IC). Such an IC will normally incorporate drivers for a number (e.g. 56) of adjacent channels and may be connected to ICs driving other groups of channels in the printhead (8 ICs will be required in a printhead having 500 channels) to allow data to be cascaded through as known in the art.

A particular advantage of the kind of printhead described above is its ability to operate in "multipulse greyscale" mode. As described, e.g. in EP-A-0 422 870, this involves firing a variable number of ink droplets (referred to as a "packet") from a single channel within a short period of time so as to merge in flight and/or on the substrate to form a correspondingly variable-size printed dot. It will appreciated that the use of variable-size printed dots allows a significant increase in image quality over printing with fixed dot size (so-called "binary" printing).

The disadvantage of such an approach is the concomitant increase in the amount of data to be fed to the driver circuitry for each channel. For example, instructing the ejector of up to fifteen droplets per packet necessary to print photographic quality images with a printhead having a 360 dots-per-inch nozzle pitch requires 16 data levels (15 dot sizes plus zero) expressed in four bits. Measures therefore need to be implemented to ensure sufficient data flow, particularly where there are a large number of nozzles (there may be over 4600 in a 360 dpi printhead having a 12 inch print width) or where the rate at which droplet packets are ejected is high (typically 10 kHz). Such measures, well-known in the art, may include a reduction in the number of ICs that are cascaded together and an associated increase in the number of data inputs necessary to drive each group of cascaded ICs.

Each of the droplets in a multipulse "packet" will understandably require only a fraction of the volume of a corresponding single droplet ejected by a "binary" printhead. This can be achieved by a combination of reduced active channel length and smaller diameter nozzles as is known in the art—the increased risk of blockage of the smaller nozzles being offset in the printhead of FIG. 12 by an arrangement of inlet manifold 118 and outlet manifolds 120,122 formed in a support 124 that ensures a constant flow of ink past the nozzle, as is well-known per se.

The present invention is not restricted to the "chevron" polarisation configuration and that there may be instances in which it is desirable to start from a sheet of piezo-material which has not been poled or poled in a direction other than the thickness direction, in which case application of the present invention will result in an upper wall portion that is similarly unpolarised or poled in a direction other than the thickness direction.

What is claimed is:

1. Method of polarising a portion of a monolithic piezoelectric actuator element for use in droplet deposition apparatus, the element having first and second portions, the method comprising the steps of:

placing a first conducting layer in contact with the first portion of the element and placing the first portion of the element at an equipotential, and generating a polarising electric field across the second portion between said first portion and a further conducting layer.

2. Method according to claim 1, wherein said step of placing the first portion of the element as an equipotential includes locating the first conducting layer so as to partially enclose the first portion.

3. Method according to claim 1, wherein the first portion of the element is polarised.

4. Method according to claim 3 and further comprising the step of generating a polarising electric field across the second portion in a direction such as to polarise the second portion in a direction opposite to the direction of polarisation of the first portion of the element.

5. Method according to claim 1, wherein the first portion of the element is polarised in a direction perpendicular to the direction in which said portions are deflectable to effect ejection of a droplet from said droplet deposition apparatus.

6. Method according to claim 1, wherein the piezoelectric actuator element is defined between two channels formed in a homogeneous sheet of piezomaterial, each channel being defined by facing side wall surfaces and a bottom surface extending between the side wall surfaces.

7. Method according to claim 6, wherein at least one of the said two channels is adapted to contain droplet fluid.

8. Method according to claim 6 and including the step of generating a polarising electric field in direction parallel to said facing side wall surfaces and perpendicular to the longitudinal axis of the channel.

9. Method according to claim 6, wherein said first and second portions lie remote from and adjacent to a respective channel bottom surface respectively.

10. Method according to claim 6, wherein said first and second portions lie adjacent to and remote from a respective channel bottom surface respectively.

11. Method according to claim 6, wherein at least one of said two channels is formed in a first surface of said sheet, a further portion of the sheet lying between the bottom surface of said at least one of the two channels and the opposite surface of the sheet to said first surface.

12. Method according to claim 11, wherein said further portion is polarised in a direction parallel to the direction of polarisation of said first portion.

13. Method according to claim 11 and further comprising the steps of locating a second conducting layer so as to partially enclose said first and second portions and generating a polarising electric field across the further portion between the second conducting layer and said further conducting layer.

14. Method according to claim 1 and further comprising the step of locating actuating electrodes on said first and second portions so as to be able to deflect both portions simultaneously.

15. Method according to claim 14 and further comprising the step of locating said actuating electrodes so as to apply an electric field in a direction normal to the direction of polarisation of said second portion.

16. Method according to claim 15 when dependent on any of claims 6 to 13 and further comprising the step of locating said actuating electrodes on respective channel-facing side wall surfaces.

17. Component for use in droplet deposition apparatus comprising
- a homogeneous sheet of piezo-material formed with a multiplicity of parallel, open-topped channels mutually spaced in an array direction normal to the length of the channels and defined each by facing side walls and a bottom surface extending between the side walls;
- at least one of said side walls having a first portion remote from a respective bottom surface and a second portion adjacent said respective bottom surface, said second portion being polarised in a direction normal to both the length of the channels and the array direction and said first portion being either unpolarised or polarised in a direction other than said first direction.

18. Component according to claim 17, wherein said first and second portions are polarised in opposite directions that lie normal to both the length of the channels and to the array direction.

19. Component according to claim 17, wherein at least one of said two channels is formed in a first surface of said sheet, a further portion of the sheet lying between the bottom surface of said at least one of the two channels and the opposite surface of the sheet to said first surface.

20. Component according to claim 19, wherein said further portion is polarised in a direction parallel to the direction of polarisation of said first portion.

21. Component according to claim 20, wherein said further portion is polarised in a direction opposite to that of said first portion.

22. Component according to claim 17, wherein actuating electrodes are located on said first and second portions so as to be able to deflect both portions simultaneously.

23. Component according to claim 22, wherein said actuating electrodes are located so as to apply an electric field in a direction perpendicular to the direction of polarisation of said second portion.

24. Component according to claim 23, wherein said actuating electrodes are located on respective channel-facing side walls.

25. Component according to claim 22, wherein said actuating electrodes are located on respective channel-facing side walls.

* * * * *

UNITED STATES PATENT AND TRADEMARK OFFICE
CERTIFICATE OF CORRECTION

PATENT NO.    : 6,505,918 B1
DATED         : January 14, 2003
INVENTOR(S)   : Angus Condie et al.

It is certified that error appears in the above-identified patent and that said Letters Patent is hereby corrected as shown below:

<u>Column 9,</u>
Lines 13-14, please delete "when dependent on any of claims 6 to 13" and insert
-- wherein the piezoelectric actuator element is defined between two channels formed in a homogeneous sheet of piezomaterial, each channel being defined by facing side wall surfaces and a bottom surface extending between the side wall surfaces, --.

Signed and Sealed this

Seventeenth Day of August, 2004

JON W. DUDAS
*Acting Director of the United States Patent and Trademark Office*